United States Patent [19]

Kayashima et al.

[11] Patent Number: 5,182,790
[45] Date of Patent: Jan. 26, 1993

[54] INFRARED OPTICAL FIBER AND A METHOD OF MANUFACTURING THE SAME

[75] Inventors: Kazuhiro Kayashima; Fumikazu Tateishi, both of Hirakata; Kiyoko Ohshima, Shijonawate, all of Japan

[73] Assignee: Matsushita Electric Industrial Co., Ltd., Osaka, Japan

[21] Appl. No.: 679,877

[22] Filed: Apr. 3, 1991

[30] Foreign Application Priority Data

Apr. 5, 1990 [JP] Japan .................................. 2-91701

[51] Int. Cl.$^5$ .............................................. G02B 6/16
[52] U.S. Cl. ...................................... 385/141; 264/1.5; 65/3.11
[58] Field of Search ............... 350/96.29, 96.30, 96.31, 350/96.32, 96.33, 96.34; 264/1.5; 65/3.11, 3.12; 385/123, 124, 141-142, 144

[56] References Cited

U.S. PATENT DOCUMENTS

| | | | |
|---|---|---|---|
| 4,253,731 | 3/1981 | Anderson et al. | 350/96.34 |
| 4,504,298 | 3/1985 | Yokota et al. | 65/3.11 |
| 4,521,073 | 6/1985 | Murakami et al. | 350/96.34 |
| 4,552,434 | 11/1985 | Murakami et al. | 350/96.30 |
| 4,678,274 | 7/1987 | Fuller | 350/96.34 |
| 4,721,360 | 1/1988 | Murakami et al. | 350/96.34 |
| 4,865,418 | 9/1989 | Takahashi et al. | 350/96.30 |
| 4,955,689 | 9/1990 | Fuller et al. | 350/96.34 |
| 5,076,653 | 12/1991 | Kayashima et al. | 385/142 X |

FOREIGN PATENT DOCUMENTS

| | | |
|---|---|---|
| 0357790 | 3/1990 | European Pat. Off. . |
| 55-124103 | 9/1980 | Japan . |
| 61-128207 | 6/1986 | Japan . |
| 61-193107 | 8/1986 | Japan . |
| 1-255807 | 10/1989 | Japan . |
| 2-093405 | 4/1990 | Japan . |

OTHER PUBLICATIONS

K. Takahashi, et al., "Silver Halide Infrared Fiber", 128 Sumitomo Denki pp. 123-130 (1988).

A. Sa'ar et al., "Optical and Mechanical Properties of Silver Halide Fibers", 843 Proc. Spie-Int. Soc. Opt. Eng. 98 (1988), pp. 2-8.

Kazuhiro Kayashima et al., "The Development of Flexible Infrared Optical Fiber for $CO_2$ Laser", *Central Research Lab.*, Matsushita Electric Industrial Co., Ltd. Jun. 15, 1990), pp. 96-102.

V. G. Artyushenko et al., "Infrared Polycrystalline Waveguides Made of Silver Halides", 16 *Soviet Journal of Quantum Electronics*, 389-92 (Mar 1986).

N. Barkay et al., "Optical Properties of Mixed Silver Halide Crystals and Polycrystalline Optical Fibers", 1048 *SPI-Int. Soc. Opt. Eng.*, 9-16 (1989).

*Primary Examiner*—Akm E. Ullah
*Attorney, Agent, or Firm*—Panitch, Schwarze, Jacobs & Nadel

[57] ABSTRACT

An infrared optical fiber is provided which includes silver halide polycrystals having a composition ratio of silver chloride and silver bromide in the range of 30 to 70 percent by weight of silver chloride, and having an average grain size of 5 μm or less. There also is provided a method of manufacturing such an infrared optical fiber, in which a silver halide single crystal having a composition ratio of silver chloride and silver bromide in the range of 30 to 70 percent by weight of silver chloride is extruded into an infrared optical fiber, while applying an extruding pressure of 70 kg/mm$^2$ or more and a tensile load which is greater than the yield strength and smaller than the tensile strength.

6 Claims, 8 Drawing Sheets

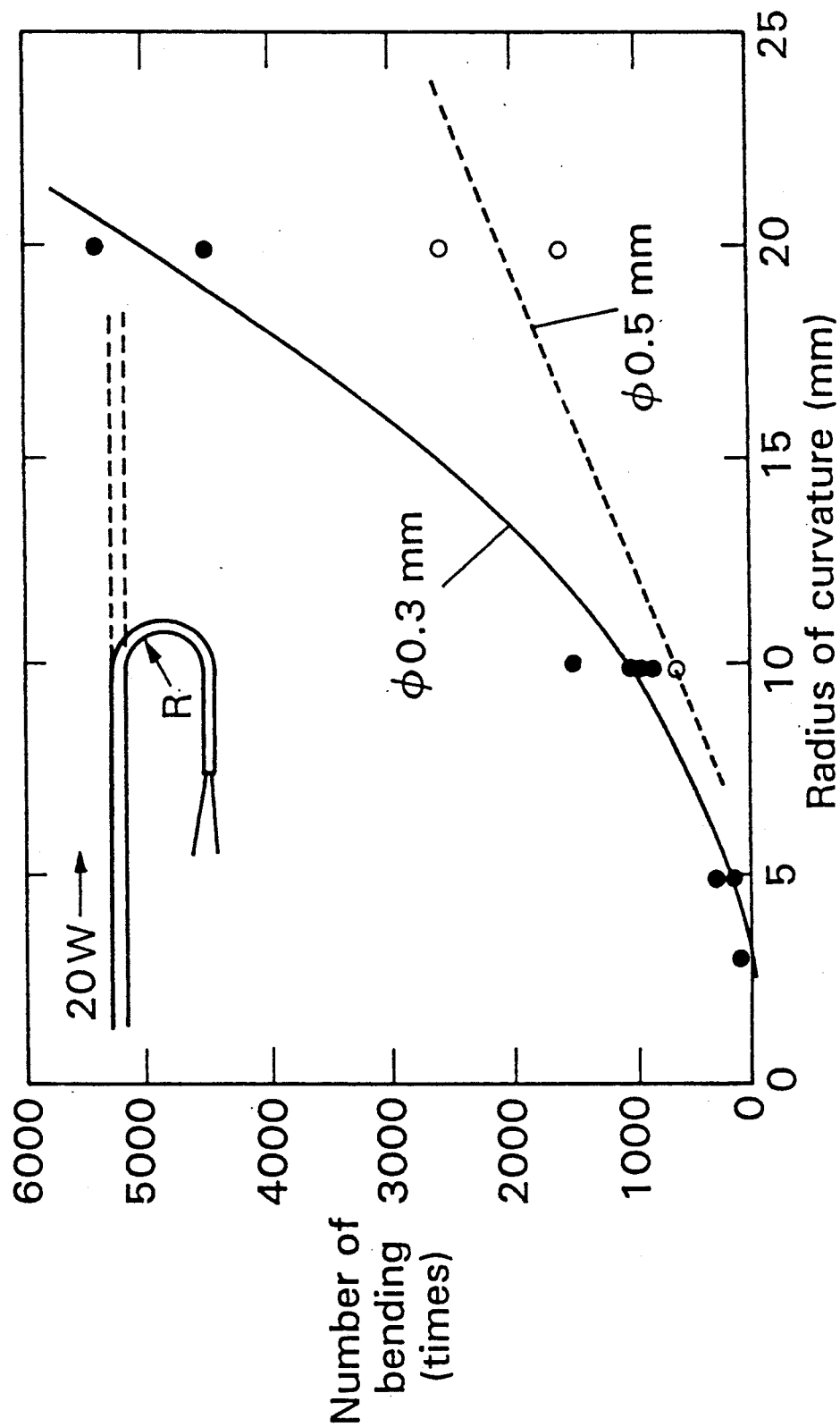

INFRARED OPTICAL FIBER AND A METHOD OF MANUFACTURING THE SAME

BACKGROUND OF THE INVENTION

1. Field of the Invention

This invention relates to an infrared optical fiber used as an optical transmission line in a laser beam machine or a laser medical instrument, and it also relates to a method of manufacturing the infrared optical fiber.

2. Description of the Prior Art

In the early 1960's, a laser beam capable of forming a light spot with an extremely high power intensity was developed. The development of such a laser beam was immediately followed by the use of laser beams for processing materials at a distance therefrom. In the beginning, since the laser beam is suitable for fine processing, laser material processing was considered as a new useful technique for enhancing the miniaturization and diversification of industrial products. Then, a high-power laser beam was developed, which was used for cutting nonmetallic materials such as plywood and cloth, along curved lines. With an increase in the power of a laser beam, lasers also become used to cut or weld metal plates. Typical examples of lasers currently used for material processing include a $CO_2$ laser and a YAG laser, both of which are used in different fields in accordance with their own characteristics.

Laser medical instruments are widely used in the field of medicine, e.g., in clinical testing, diagnosis, medical treatments, medical operations, and the like. Laser medical instruments are required to have high operativity under special conditions (good hygiene, limited space, etc.). Thus, the use of optical fibers is indispensable for laser medical instruments. The development of quartz optical fibers capable of transmitting high-power laser beams contributed to great progress in the application of lasers to the medical field.

In laser medical instruments, various kinds of lasers are currently used according to the purpose of the operation. For example, a $CO_2$ laser is widely used in surgical operations because of its high absorptivity in the living organism and its superior incising and vaporizing capabilities. On the other hand, laser beams emitted from an excimer laser, Nd-YAG laser, or Er-YAG laser can be transmitted through a quartz optical fiber which has high flexibility. Thus, these laser beams can be directed by a quartz optical fiber into the interior of a human body for solidification and hemostasis of gastric parietes, for removing arteriosclerotic portions from coronary arteries, and for other medical treatments.

Fused quartz is used as a flexible optical transmission line because it can be processed into a fiber and also because it has an excellent transmittance for near-infrared light emitted from a YAG laser and visible light emitted from an argon laser. On the other hand, a laser beam emitted from a $CO_2$ laser cannot be transmitted through a quartz optical fiber because it has a wavelength of 10.6 $\mu$m and so falls within the category of medium infrared radiation. For the transmission of $CO_2$ laser beams, mirror articulated optical waveguide using a combination of mirrors is employed because of its high transmission efficiency.

The mirror articulated optical waveguide, however, lacks flexibility and operativity, and is large and heavy, and has problems associated with difficulty in adjustment of its optical axis. Thus, many efforts have been made to replace it with an infrared optical fiber. As a result, some infrared optical fibers have been put into practical use for general surgery, but an infrared optical fiber having such flexibility as to be required for precise medical operations has yet to be developed.

In particular, there has recently been a need for a so-called "$CO_2$ laser endoscope" that enables the treatment of internal organs to be performed without an external medical operation for cutting open the body, by inserting the infrared optical fiber along with the endoscope into the interior of the body to direct the $CO_2$ laser beam to the diseased part. Furthermore, a "laser treatment within a coronary artery" has recently attracted attention, which enables the removal of arteriosclerotic part from the coronary artery without cutting open the body. But the current infrared optical fibers completely lack flexibility for these applications. The infrared optical fiber used in these applications is required to have sufficient flexibility to be easily bent within the interior of the body, and is also required to have the capability of transmitting high-power laser beams for incising and vaporizing the diseased part.

In general, when an infrared optical fiber is used for a laser endoscope, it is required to retain its power transmission capability against repeated bending of approximately 2,000 times with a curvature radius of 20 mm. When it is used for a laser treatment within an artery, it is required to retain its power transmission capability against repeated bending of approximately 100 times with a curvature radius of 10 mm. These values were obtained as follows: In fact, a laser endoscope is repeatedly used for medical operations, so that the following expression can be given; about 50 (the number of times a fiber used for the laser endoscope is bent per operation)$\times$40 (the number of operations in two months)=-about 2,000 (the number of bending required for the fiber). In a laser treatment within an artery, an infrared optical fiber is used only for one operation. The maximum number of times the optical fiber should bend per operation was estimated to be about 100 because it should be able to pass through a tortuous path within the body.

Furthermore, an infrared optical fiber used for a laser endoscope is also required to have excellent optical characteristics such as transmittance and launching angle of the laser beam.

Metal halides such as thallium halide, cesium halide and silver halide are known as materials for an infrared optical fiber which can transmit a $CO_2$ laser beam with high efficiency. In general, an optical fiber made of a metal halide has inferior mechanical bending characteristics and thus easily breaks. But an infrared optical fiber formed from silver halide is relatively flexible and does not easily break, so that various researches are under way for the production of an improved infrared optical fiber from silver halide.

An infrared optical fiber has been reported which is formed from a material having low water-solubility in view of stability and having a great elongation rate at rupture, i.e., capable of being greatly elongated until it ruptures, in view of flexibility, the material being prepared by adding 2 percent by weight of silver chloride to silver bromide based on the weight of silver bromide (Takahashi, et al., Sumitomo Denki (1988) No. 128, p. 123). According to the report, the obtained infrared optical fiber has excellent durability such as resistance to repeated bending (of 60,000 times with a curvature radius of 25 cm) and a long lifetime. The report has further described on an infrared optical fiber formed from materials with an improved elongation rate at rupture by adding 0.01 to 10 percent by weight of silver chloride to silver bromide or of silver bromide to silver chloride. However, while the above conventional infrared optical fibers do not break by being bent with a radius of as small as 20 mm because of their great elongation rate, they are susceptible to plastic deformation due to the bending because of their small yield stress, causing fusing at the deformed portion during the laser beam transmission, or resulting in degradation in the optical characteristics.

There has also been a report on an infrared optical fiber formed to have a diameter of 0.9 mm from a material with mechanical strength improved by using silver chloride and silver bromide in an equivalent mole ratio in its composition (A. Sa'ar, et al., Proc. Spie-Int. Soc. Opt. Eng. (USA) 843 (1988). But this optical fiber is disadvantageous in that a slight number of repetitive bending with a radius of 20 mm causes the fiber to be fused during the laser beam transmission, lowers the optical characteristics of the fiber, and sometimes causes the fiber to break.

Particularly when an infrared optical fiber is used for a laser endoscope in a medical operation, the optical fiber which directs a laser beam into the interior of the body is required to have:

1) flexibility enough to withstand the repeated bending of approximately 100 times with a curvature radius of 10 mm and the repeated bending of approximately 2,000 times with a curvature radius of 20 mm (the minimum radius with which a laser endoscope for digestive organs can bend is 20 mm); and 2) excellent optical characteristics such as the capability of transmitting laser beams with an output power of 10 W or more and a small launching angle of 15 degrees or less.

For the manufacture of an infrared optical fiber, hot extrusion of metal halide materials has been employed. In a conventional hot extrusion technique, however, the infrared optical fiber has a tendency to be molded in a corrugated form as shown in FIG. 9, the extrusion speed is slow, and the obtained infrared optical fiber has a laser beam launching angle of as large as 20 to 30 degrees. This tendency becomes particularly noticeable in the extrusion of silver halide materials with improved mechanical strength, and thus it has been impossible to extrude an infrared optical fiber with excellent optical characteristics.

SUMMARY OF THE INVENTION

The infrared optical fiber of this invention, which overcomes the above-discussed and numerous other disadvantages and deficiencies of the prior art, comprises silver halide polycrystals having a composition ratio of silver chloride and silver bromide in the range of 30 to 70 percent by weight of silver chloride, and having an average grain size of 5 $\mu$m or less.

In a preferred embodiment, the aforementioned infrared optical fiber has a tensile strength of 8.5 $kg/mm^2$ or more.

In a preferred embodiment, the aforementioned infrared optical fiber has a diameter of 0.5 mm or less.

The method of manufacturing an infrared optical fiber according to this invention comprises the steps of extruding a silver halide single crystal into an infrared optical fiber, while applying an extruding pressure of 70 $kg/mm^2$ or more and a tensile load which is greater than the yield strength and smaller than the tensile strength, wherein the silver halide single crystal has a composition ratio of silver chloride and silver bromide in the range of 30 to 70 percent by weight of silver chloride.

In a preferred embodiment, the aforementioned silver halide single crystal is extruded from a die having a diameter of 0.5 mm or less.

In a more preferred embodiment, the aforementioned silver halide single crystal is extruded from a die having a diameter of 0.3 mm at a temperature of 180° C. to 240° C., while an extruding pressure of 70 $kg/mm^2$ or more and a tensile load of 100 to 350 g are applied thereto.

Thus, the invention described herein makes possible the objectives of (1) providing an infrared optical fiber having great mechanical strength and excellent mechanical bending characteristics, and also having excellent optical characteristics such as a high transmittance, low absorption loss, low scattering loss, and small launching angle; (2) providing an infrared optical fiber having flexibility enough to easily bend in the interior of a human body and having power transmission capability for cutting and vaporizing the diseased part of the body; (3) providing an infrared optical fiber which can be applied to laser endoscopes and laser treatments within an artery and which can transmit a high-power $CO_2$ laser beam with high efficiency, thereby significantly expanding the application range of $CO_2$ lasers; and (4) providing a method of manufacturing an infrared optical fiber having these excellent characteristics with high efficiency.

BRIEF DESCRIPTION OF THE DRAWINGS

This invention may be better understood and its numerous objects and advantages will become apparent to those skilled in the art by reference to the accompanying drawings as follows:

FIG. 8 is a graph showing the relationship between the radius of bending curvature and the maximum number of bending of two infrared optical fibers with different diameters.

DESCRIPTION OF THE PREFERRED EMBODIMENTS

The infrared optical fiber of this invention is made of silver chloride-silver bromide polycrystals having 30 to 70 percent by weight of silver chloride and 70 to 30 percent by weight of silver bromide, based on the total weight of the polycrystals. The composition of the polycrystals is represented by the chemical formula $AgCl_xBr_{1-x}$ ($0.36 \leq x \leq 0.75$). The infrared optical fiber is produced by extruding a silver chloride-silver bromide single crystal, while a predetermined extruding pressure and a predetermined tensile load are being applied thereto, so that the single crystal is converted into polycrystals having an average grain size of 5 μm or less.

Figure 1:
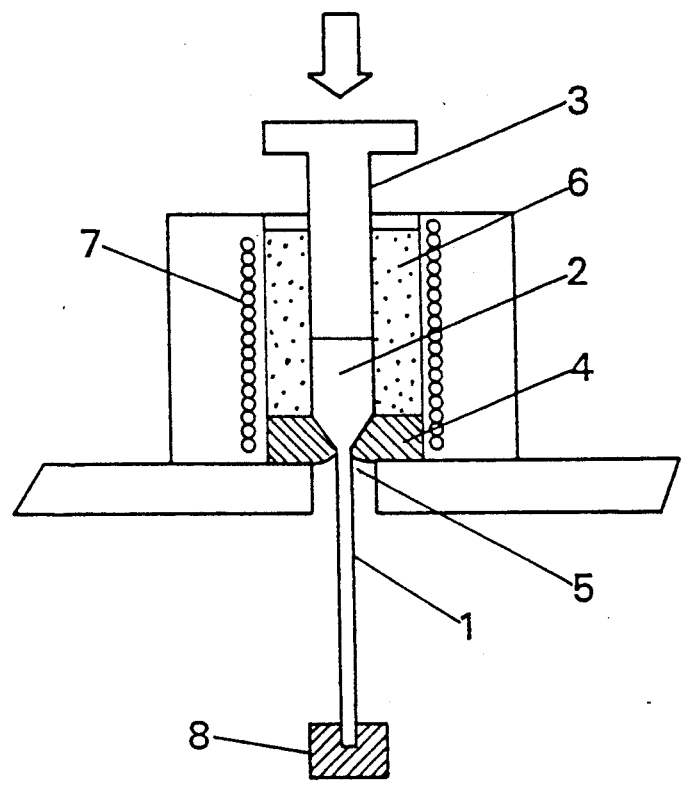
FIG. 1 is a schematic diagram showing an apparatus for use in manufacturing an infrared optical fiber of this invention.

FIG. 1 shows an apparatus used for the manufacture of an infrared optical fiber according to this invention. An infrared optical fiber 1 is produced using such an apparatus, for example, as follows:

First, silver chloride and silver bromide, both having an impurity concentration of 0.5 ppm or lower, are mixed with each other to have a composition ratio of silver chloride and silver bromide in the range of 30 to 70 percent by weight of silver chloride, and the mixture is melted with no exposure to light, so that a single crystal of silver chloride and silver bromide is prepared at a crystal growth rate of 0.1 to 0.6 mm/h by the Bridgman method. The obtained single crystal is formed into a cylindrical preform crystal 2 with a diameter of about 8 mm. The preform crystal 2 is placed in a container 6. Then, while the temperature of the preform crystal 2 is being kept at 150° C. to 220° C. by means of a heater 7, an extruding pressure of 50 to 150 kg/mm$^2$ is applied to the preform crystal 2 by means of a pressurizing ram 3 which is driven by a hydraulic press, and a tensile load is applied to the preform crystal 2 by means of a weight 8. Under these conditions, the infrared optical fiber 1 is obtained by extruding the preform crystal 2 from a nozzle 5 of a die 4. The diameter of the nozzle 5, which determines the diameter of the infrared optical fiber 1 to be extruded, is preferably in the range of 0.3 to 0.5 mm. The die 4 is made of silicon nitride ceramics which have excellent hardness and excellent corrosion resistance to halide materials, or made of sodium thiosulfate ($Na_2S_2O_3$) which is usually used for cleaning halide materials. The weight 8 has a weight greater than the yield strength and smaller than the tensile strength of the infrared optical fiber to be extruded. A weight of 100 to 350 g within the above load range is suitable for an infrared optical fiber to be extruded to have a diameter of 0.3 mm at a temperature of 180° C. to 240° C.

Figure 9:
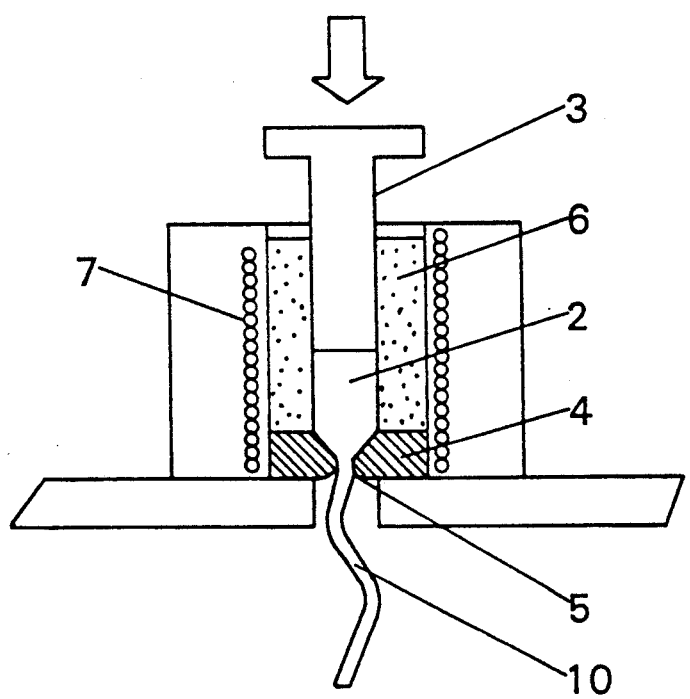
FIG. 9 is a schematic diagram showing an apparatus for use in manufacturing a conventional infrared optical fiber.

As shown in FIG. 9, when no tensile load is applied, an infrared optical fiber 10 is molded in a corrugated form and the extrusion speed is lowered. The application of no tensile load also increases the laser beam launching angle of the resultant infrared optical fiber to an angle in the range of 20 to 30 degrees. When the diameter of the nozzle 5 of the die 4 is required to be as small as 0.3 mm, it is difficult to form the hole in the nozzle 5 in an appropriate shape with high accuracy. The nozzle 5 with an inappropriately-shaped hole inhibits the smooth extrusion of the preform crystal 2, thereby lowering the extrusion speed. Also because of an inappropriately-shaped hole of the nozzle 5, the strain generated in the container 6 cannot be removed from the portion of the preform crystal 2 within the nozzle 5, thereby forming the infrared optical fiber in a corrugated shape.

In the method of this invention, while an extruding pressure is being applied to the preform crystal, a tensile load greater than the yield strength and smaller than the tensile strength of the infrared optical fiber to be extruded is applied thereto. These applications cause plastic deformation of the portion of the infrared optical fiber near the outlet of the nozzle, thereby making the extruded infrared optical fiber straight. Thus, even if the diameter of the nozzle is as small as 0.3 mm, a straight infrared optical fiber can be obtained. The application of the tensile load as well as the extruding pressure increases the extrusion speed, thereby reducing the period of time required for the production of infrared optical fibers. Furthermore, an infrared optical fiber extruded with the application of the tensile load retains excellent optical characteristics such as a high transmittance, and has a small launching angle of 15 degrees or less, thereby attaining excellent laser beam emission.

This invention will be further illustrated by reference to the following example, but this example is not intended to restrict the invention.

EXAMPLE

Figure 2:
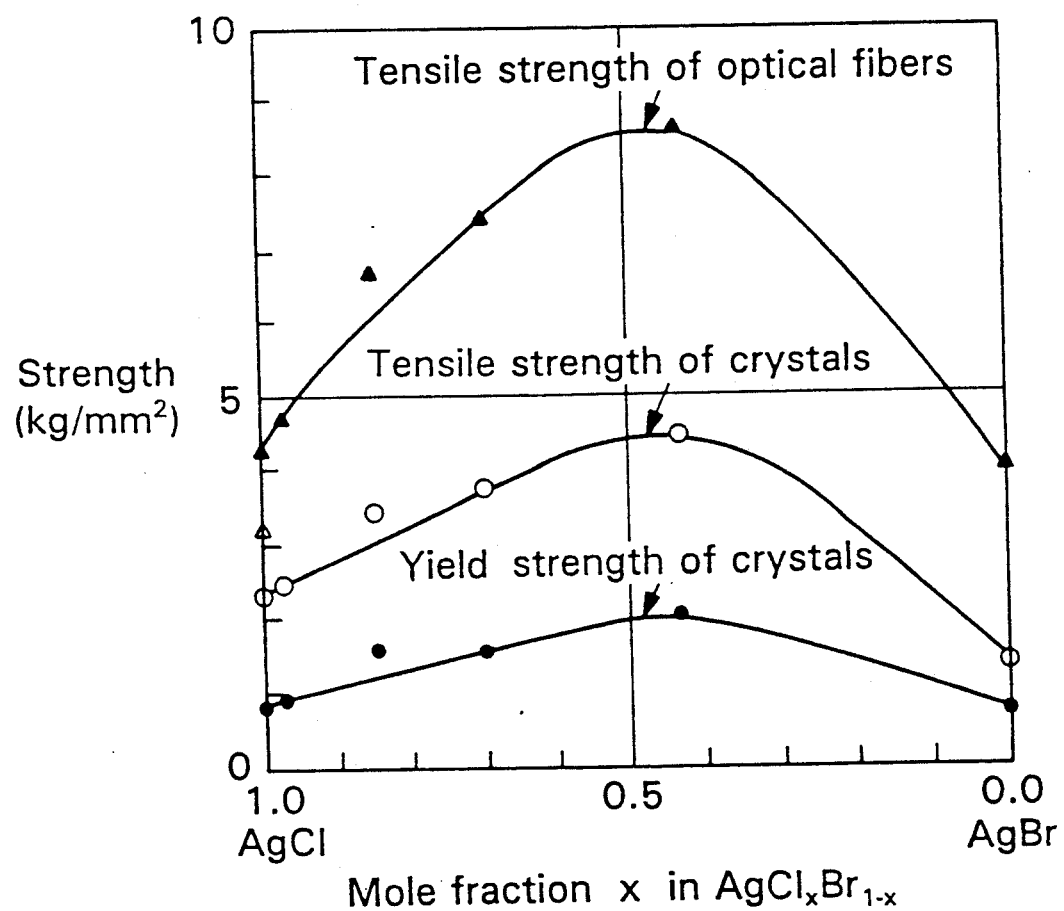
FIG. 2 is a graph showing the yield strength and the tensile strength of silver chloride-silver bromide single crystals with respect to the mole fraction of silver bromide and also showing the tensile strength of infrared optical fibers prepared from the silver chloride-silver bromide single crystals.

First, silver chloride-silver bromide single crystals having different composition ratios were prepared. Using these single crystals, infrared optical fibers (0.3 mm in diameter and 1.5 m in length) were extruded with the temperature kept at 220° C. The extruding pressure and the tensile load were varied depending on the composition ratio of the single crystals. The tensile strength of each infrared optical fiber thus prepared was measured. The results are shown in FIG. 2, which also shows the yield strength and the tensile strength of the respective single crystals. The single crystals should have sufficient mechanical strength, particularly yield strength, so as to have resistance to plastic deformation. This is because excessive plastic deformation in the portion of the single crystal near the outlet of the nozzle lowers the optical characteristics of the resultant infrared optical fiber. As can be seen from FIG. 2, it is preferred that the silver chloride-silver bromide single crystals have 30 to 70 percent by weight of silver chloride and 70 to 30 percent by weight of silver bromide.

Next, the mechanical and optical characteristics of infrared optical fibers with respect to the extruding pressure (or the average grain size of polycrystals) were examined. For the examination, silver chloride-silver bromide single crystals having 43 percent by weight of silver chloride and 57 percent by weight of silver bromide were prepared. Using these single crystals, infrared optical fibers were produced to have a diameter of 0.3 mm and a length of 1.5 m with the extruding pressure, the tensile load, and the temperature kept at constant levels. In order to maintain the extrusion speed at a predetermined level, when the extruding pressure was set at 30, 50, 60, 70, 80, 90, 100, 110, or 120 kg/mm$^2$, the tensile load was set at 100, 100, 200, 200, 200, 300, 300, 300, or 350 g, and the temperature at 310° C., 280° C., 260° C., 240° C., 230° C., 220° C., 200° C., 190° C., or 180° C.

Figure 3:
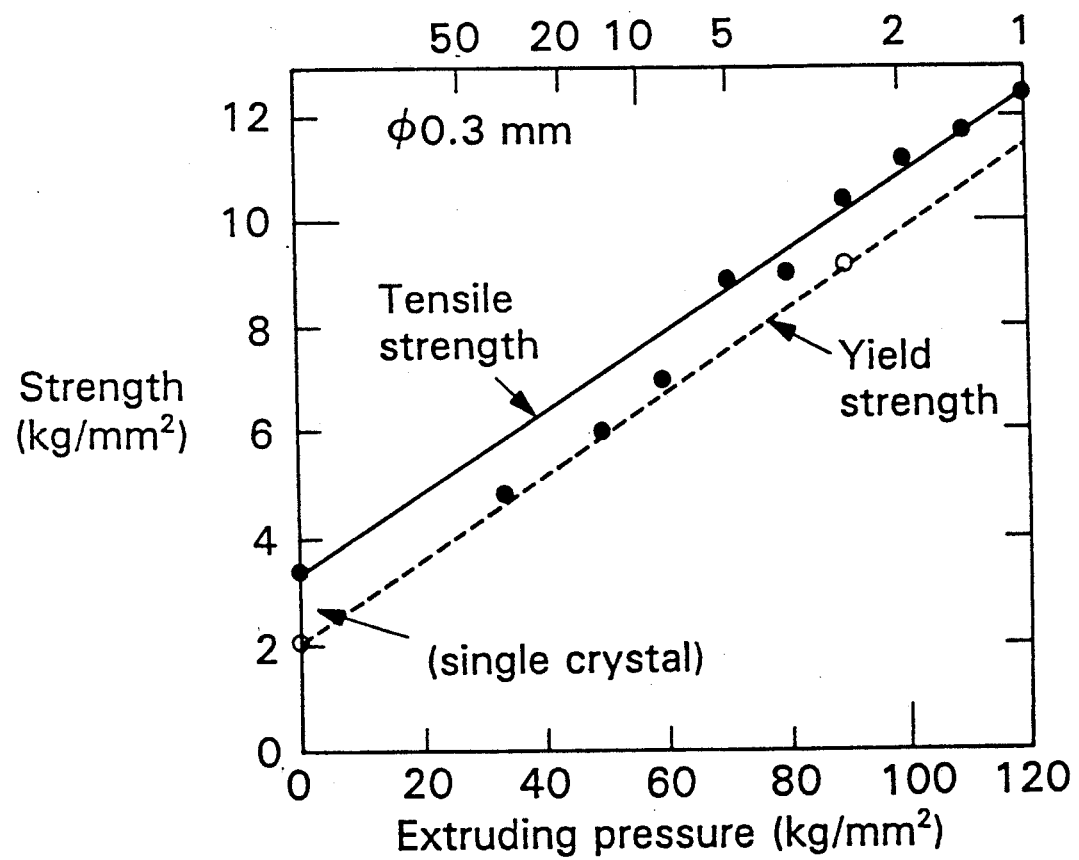
FIG. 3 is a graph showing the relationship between the extruding pressure (or the average grain size of polycrystals) and the mechanical strength (i.e., yield strength and tensile strength) of infrared optical fibers.

The mechanical characteristics of the infrared optical fibers thus prepared were measured. An infrared optical fiber taken as a sample (having a length of 10 mm) was mechanically supported at both ends and then pulled at a speed of 0.01 mm/min. As a result, a strain-stress curve was drawn, from which the relationship between the extruding pressure (or the average grain size of polycrystals) and the mechanical strength (i.e., the yield strength and tensile strength) of the infrared optical fibers was obtained as shown in FIG. 3. In the measurement, all the samples of optical fibers broke near the center thereof. As can be seen from FIG. 3, the yield strength and tensile strength of the infrared optical fibers are proportional to the extruding pressure. For example, with the extruding pressure of 120 kg/mm$^2$, which is the maximum pressure in view of the mechanical strength of the die, the mechanical strength of the extruded infrared optical fiber was four times as large as that of the single crystal (i.e., with an extrusion strength of 0 kg/mm$^2$).

Figure 4:
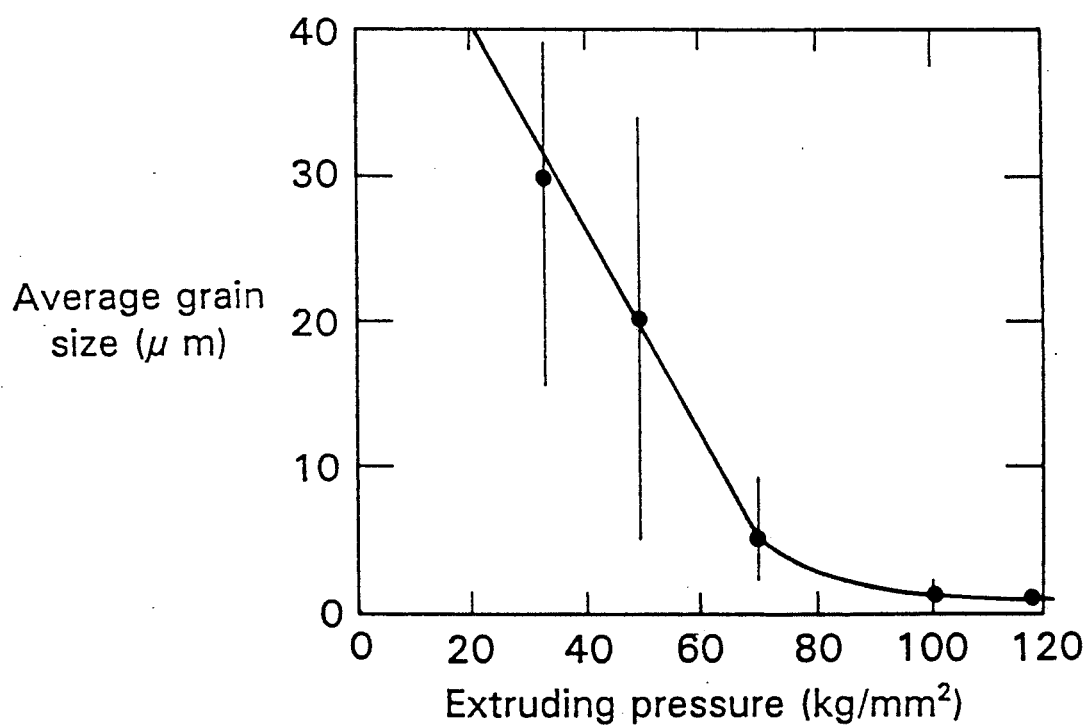
FIG. 4 is a graph showing the relationship between the extruding pressure and the average grain size of silver chloride-silver bromide polycrystals constituting the infrared optical fibers.

In order to find out the cause for the improvement in the mechanical strength, a polished facet of each infrared optical fiber was examined by means of an electron microscope, thereby determining the average grain size of silver chloride-silver bromide polycrystals of each optical fiber. FIG. 4 shows the relationship between the extruding pressure and the average grain size. As can be seen from this figure, the average grain size of the polycrystals decreases with an increase in the extruding pressure. In general, the mechanical strength of a crystal is in inverse proportion to the square root of the average grain size of the crystal. Thus, the reason for the increase in the mechanical strength of the infrared optical fiber is that the average grain size of the polycrystals is decreased by an increase in the extruding pressure. For example, with an extruding pressure of 70 kg/mm$^2$, an infrared optical fiber with an average grain size of 5 $\mu$m is obtained. This infrared optical fiber has tensile strength of 8.5 kg/mm$^2$, as shown in FIG. 3. With the maximum extruding pressure of 120 kg/mm$^2$, the average grain size of the polycrystals is about 1.2 $\mu$m and the tensile strength is 120 kg/mm$^2$ or more. In this example, the extruding pressure could not be set more than 120 kg/mm$^2$ because it is the maximum pressure in view of the mechanical strength of the silicon nitride dies. However, if dies having a greater mechanical strength are developed in the future which can increase the extruding pressure to 200 kg/mm$^2$, the average grain size of the resultant polycrystals should be decreased to about 0.1 $\mu$m.

Next, in order to evaluate the optical characteristics of the above-described infrared optical fibers, the absorption loss, scattering loss, and laser beam launching angle of the optical fibers were measured. By the use of the calorimetric measurements, the absorption loss was calculated from the calories of heat generated in the optical fibers, which were determined from the thermal expansion of the fibers and the changes in the thermal expansion with time. The scattering loss was obtained by subtracting the absorption loss from the total loss calculated from the laser beam transmittance of the optical fiber. The launching angle is an angle formed by laser emission with 90 percent of the total laser energy. The laser beam was allowed to enter each infrared optical fiber at an angle of 12 degrees.

Figure 5:
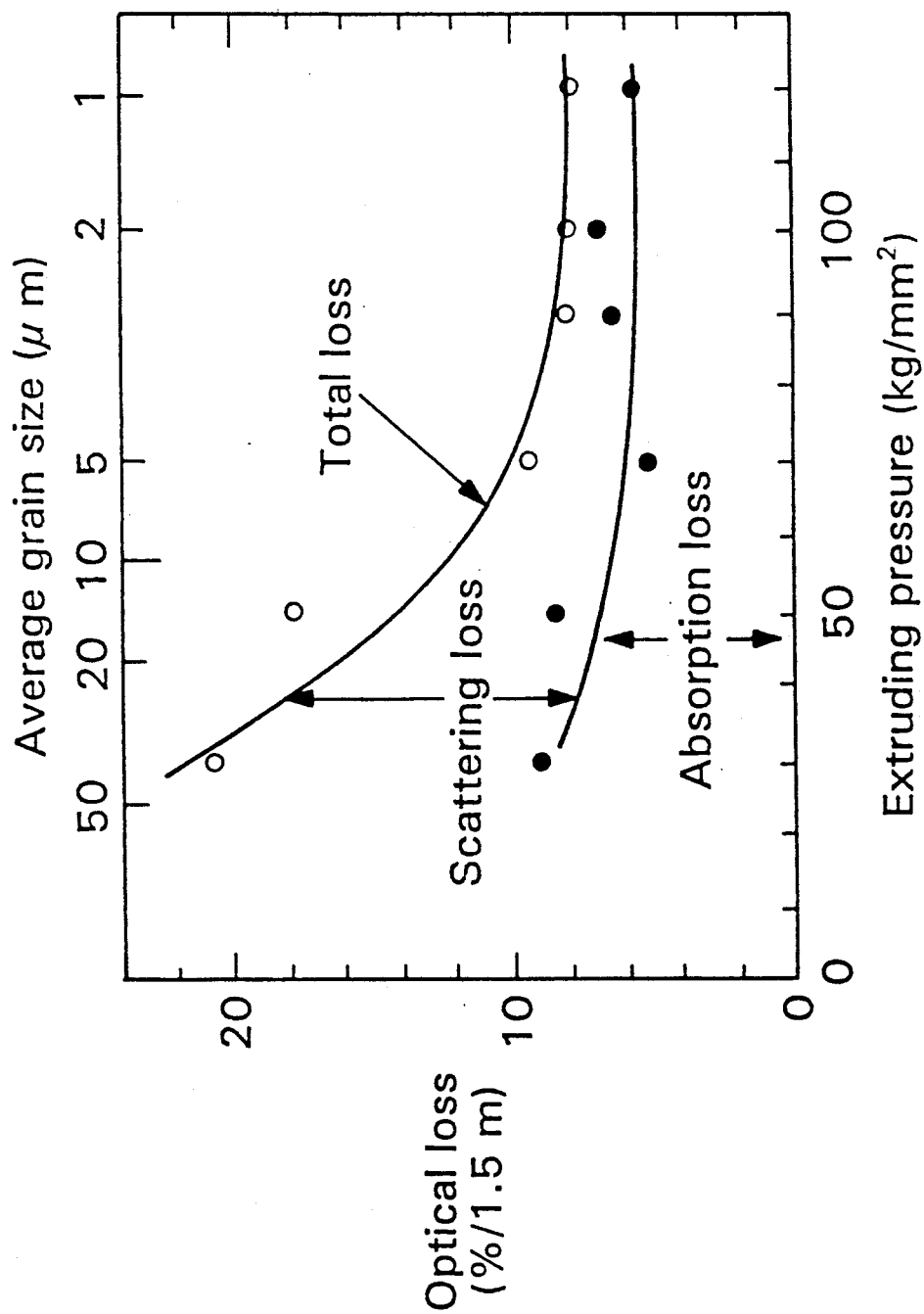
FIG. 5 is a graph showing the relationship between the extruding pressure (or the average grain size of polycrystals) and the absorption and scattering losses of infrared optical fibers.
Figure 6:
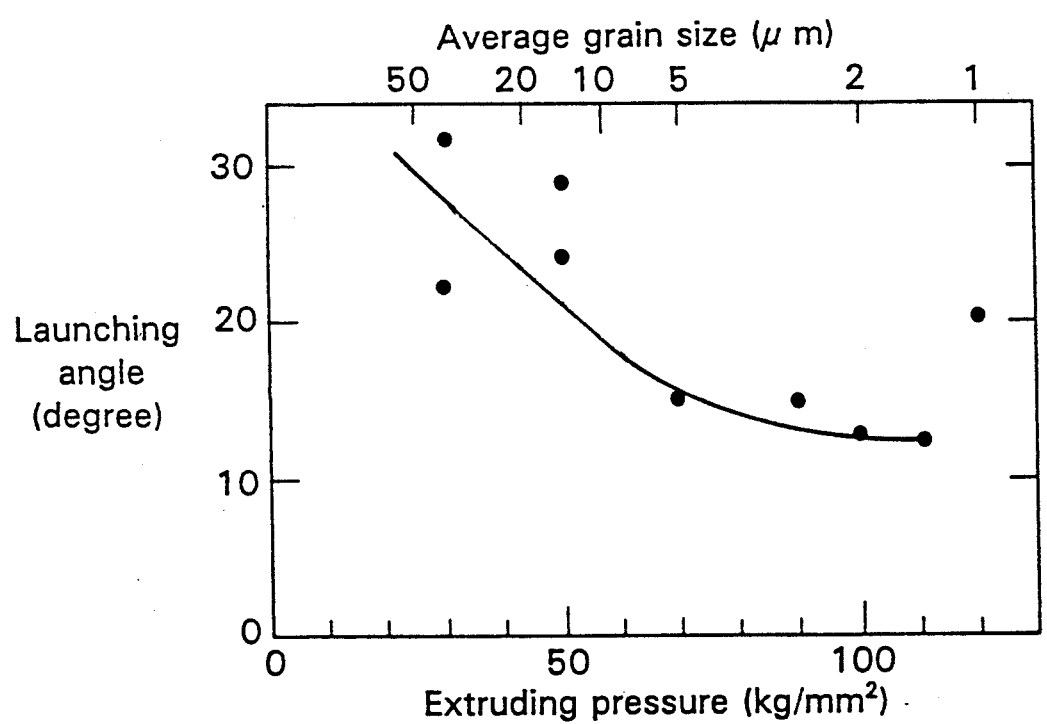
FIG. 6 is a graph showing the relationship between the extruding pressure (or the average grain size of polycrystals) and the launching angle of infrared optical fibers.

FIG. 5 shows the relationship between the extruding pressure (or the average grain size of polycrystals) and the absorption and scattering losses of the infrared optical fibers. FIG. 6 shows the relationship between the extruding pressure (or the average grain size of polycrystals) and the laser beam launching angle of the infrared optical fibers. As can be seen from FIG. 5, in an infrared optical fiber extruded with the extruding pressure of 70 kg/mm$^2$ or more, the absorption and scattering losses are substantially constant, the total loss is 10% or lower, and the launching angle is 15 degrees or less, which indicates that this infrared optical fiber is excellent in optical characteristics as well as in mechanical characteristics. However, in an infrared optical fiber extruded with the extruding pressure of less than 70 kg/mm$^2$, the optical characteristics are poor in terms of the absorption loss, scattering loss, and launching angle. Particularly, as shown in FIG. 5, the scattering loss greatly increases with a decrease in the extruding pressure, which indicates that scattering is the principal cause for a decrease in the laser beam transmittance and for an increase in the launching angle.

Figure 7:
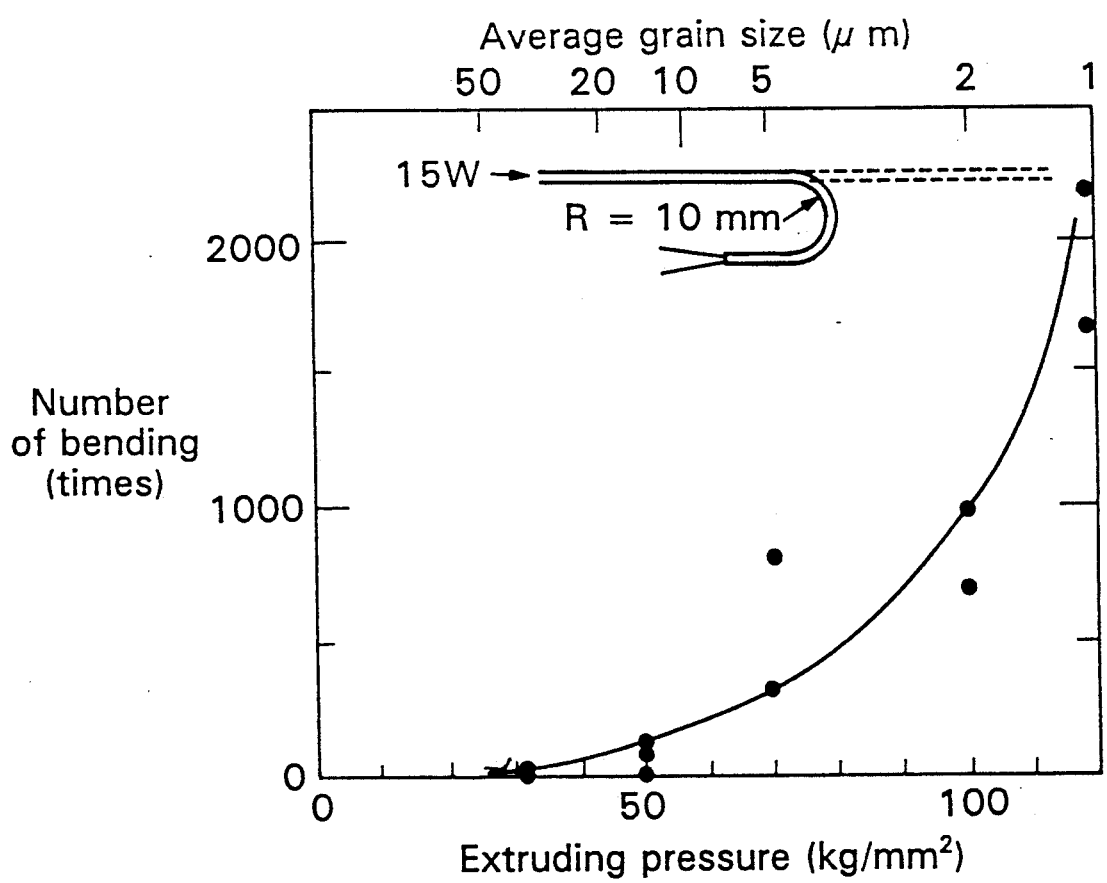
FIG. 7 is a graph showing the relationship between the extruding pressure (or the average grain size of polycrystals) and the maximum number of bending of infrared optical fibers.

Finally, the most important characteristics of infrared optical fibers, i.e., the bending characteristics were examined. In this experiment, while a laser beam of 15 W was being directed into an infrared optical fiber, the optical fiber was repeatedly bent at an angle of 180 degrees with a bending radius of 10 mm. The bending characteristics were determined by the number of times the optical fiber was bent until it burned. The results are shown in FIG. 7. As can be seen from this figure, with an increase in the extruding pressure (or a decrease in the average grain size of polycrystals), the maximum number of bending increases exponentially. For example, an infrared optical fiber having an average grain size of 5 $\mu$m or less satisfies the conditions required for medical operations within an artery, i.e., this optical fiber can be bent 100 times with a bending radius of 10 mm. Furthermore, experiments were performed to determine the relationship between the bending radius and the maximum number of bending of infrared optical fibers having different diameters (particularly, 0.3 mm and 0.5 mm; the power of laser beams used being 20 W). The results are shown in FIG. 8. As can be seen from this figure, as the bending radius R becomes larger and as the diameter of an infrared optical fiber becomes smaller, the maximum number of bending becomes large. With a bending radius for actual use in medical operations, i.e., with a bending radius of 20 mm, the infrared optical fiber having a diameter of 0.3 mm can be bent approximately 5,000 times while the infrared optical fiber having a diameter of 0.5 mm can be bent approximately 2,000 times. This indicates that an infrared optical fiber with a diameter of 0.5 mm or less can be used for a laser endoscope.

As described above, in the method of this invention, a silver chloride-silver bromide single crystal having 30 to 70 percent by weight of silver chloride and 70 to 30 percent by weight of silver bromide is subjected to hot extrusion with the application of an extruding pressure of 70 kg/mm$^2$ or more and a tensile load larger than the yield strength and smaller than the tensile strength of the infrared optical fiber to be obtained. This results in an infrared optical fiber made of silver chloride-silver bromide polycrystals having an average grain size of 5 $\mu$m or less. The infrared optical fiber thus prepared has excellent optical characteristics such as low absorption and scattering losses and a small launching angle, and also has great mechanical strength, enough to be bent approximately 100 times with a bending radius of 10 mm and approximately 2,000 times with a bending radius of 20 mm. Accordingly, the infrared optical fiber of this invention can be used in laser medical instruments for operations within the interior of a human body.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in this invention, including all features that would be treated as equivalents thereof by those skilled in the art to which this invention pertains.

What is claimed is:

1. An infrared optical fiber comprising silver halide polycrystals which have a composition ratio of silver chloride and silver bromide in the range of 30 to 70 percent by weight of silver chloride, and have an average grain size of 5 $\mu$m or less, said infrared optical fiber having mechanical strength and bending characteristics sufficient to be bent approximately 100 times with a bending radius of 10 mm and approximately 2000 times with a bending radius of 20 mm, said infrared fiber having optical characteristics of high transmittance, low absorption loss, low scattering loss, and a small launching angle.

2. An infrared optical fiber according to claim 1, which has a tensile strength of 8.5 kg/mm$^2$ or more.

3. An infrared optical fiber according to claim 1, which has a diameter of 0.5 mm or less.

4. A method of manufacturing an infrared optical fiber, comprising the steps of extruding silver halide crystal into an infrared optical fiber, while applying an extruding pressure of 70 kg/mm$^2$ or more and a tensile load which is greater than the yield strength and smaller than the tensile strength, wherein said silver halide crystal has a composition ratio of silver chloride and silver bromide in the range of 30 to 70 percent by weight of silver chloride, said infrared optical fiber having absorption and scattering losses which are substantially constant, the total loss being 10% or lower, and a launching angle of 15° or less.

5. A method of manufacturing an infrared optical fiber according to claim 4, wherein said silver halide crystal is extruded from a die having a diameter of 0.5 mm or less.

6. A method of manufacturing an infrared optical fiber according to claim 5, wherein said silver halide crystal is extruded from a die having a diameter of 0.3 mm at a temperature of 180° C. to 240° C., while an extruding pressure of 70 kg/mm$^2$ or more and a tensile load of 100 to 350 g are applied thereto.

* * * * *